(12) United States Patent
Sheng et al.

(10) Patent No.: US 7,501,919 B2
(45) Date of Patent: *Mar. 10, 2009

(54) BOOSTED-BIAS TUNABLE FILTER WITH DYNAMIC CALIBRATION

(75) Inventors: Samuel W. Sheng, Los Gatos, CA (US); Michael Khitrov, Cupertino, CA (US)

(73) Assignee: Telegent Systems, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/043,662

(22) Filed: Mar. 6, 2008

(65) Prior Publication Data

US 2008/0160939 A1 Jul. 3, 2008

Related U.S. Application Data

(63) Continuation of application No. 11/459,333, filed on Jul. 21, 2006, now Pat. No. 7,427,907.

(60) Provisional application No. 60/701,652, filed on Jul. 21, 2005.

(51) Int. Cl.
*H03J 3/04* (2006.01)
*H03J 5/02* (2006.01)
*H04B 1/18* (2006.01)

(52) U.S. Cl. ............................ 334/15; 334/16; 334/78; 455/188.1; 455/195.1

(58) Field of Classification Search ................... 334/11, 334/15, 16, 78, 79; 333/167, 174; 455/150.1, 455/179.1, 188.1, 195.1
See application file for complete search history.

(56) References Cited

U.S. PATENT DOCUMENTS

| | | | |
|---|---|---|---|
| 4,590,611 A | 5/1986 | Maier et al. | |
| 5,281,931 A | 1/1994 | Bailey et al. | |
| 5,678,211 A | 10/1997 | Badger | |
| 5,822,687 A | 10/1998 | Bickley et al. | |
| 7,427,907 B2 * | 9/2008 | Sheng et al. | .................. 334/15 |
| 2002/0115420 A1 | 8/2002 | Cheng | |

FOREIGN PATENT DOCUMENTS

| | | |
|---|---|---|
| EP | 0 475 705 | 3/1992 |
| EP | 1 278 304 | 1/2003 |
| GB | 2 270 223 | 3/1994 |
| WO | WO 00/70757 | 11/2000 |

OTHER PUBLICATIONS

International Search Report and Written Opinion of the International Searching Authority in International Application PCT/US2006/028446, ISA European Patent Office, Nov. 28, 2006, 11 pgs.

* cited by examiner

*Primary Examiner*—David Mis
(74) *Attorney, Agent, or Firm*—Shemwell Mahamedi LLP

(57) ABSTRACT

In a signal communication device, a frequency-selective filter has at least one component that is biased by a control signal to establish a center frequency of the frequency-selective filter. A closed-loop bias generator is provided to generate the control signal and to adjust the control signal based, at least in part, on a comparison of the control signal and a reference signal.

39 Claims, 3 Drawing Sheets

(Prior-Art)

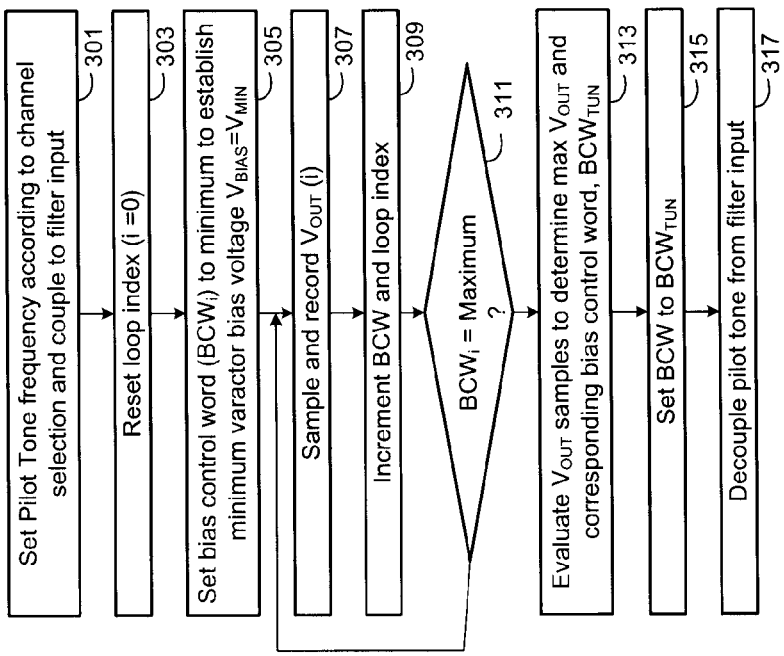
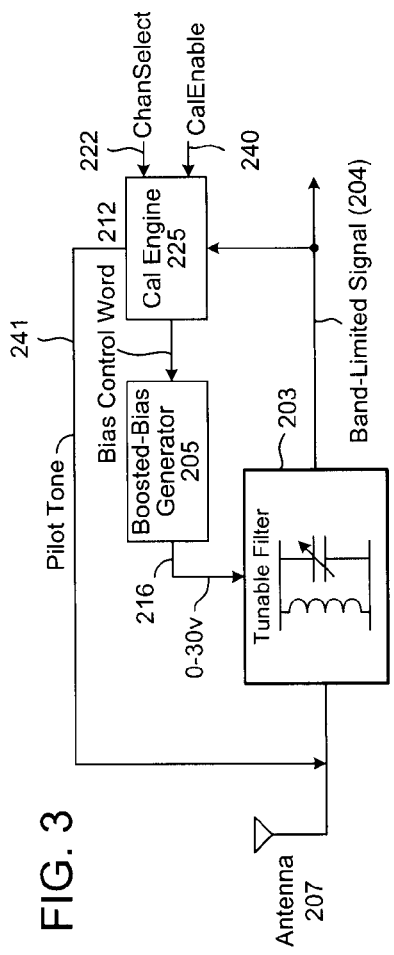
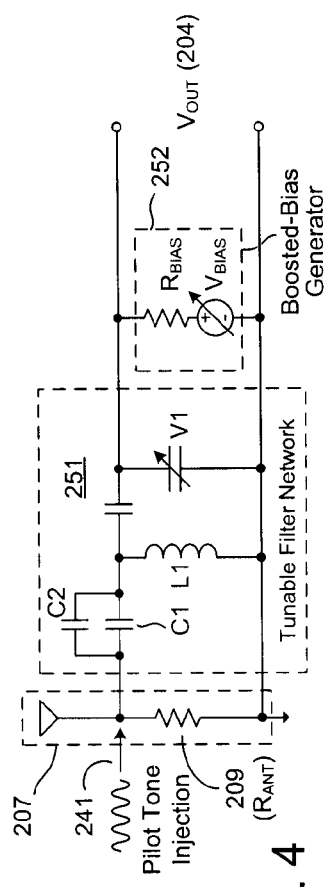
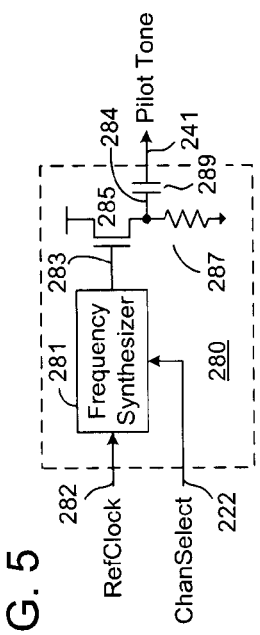
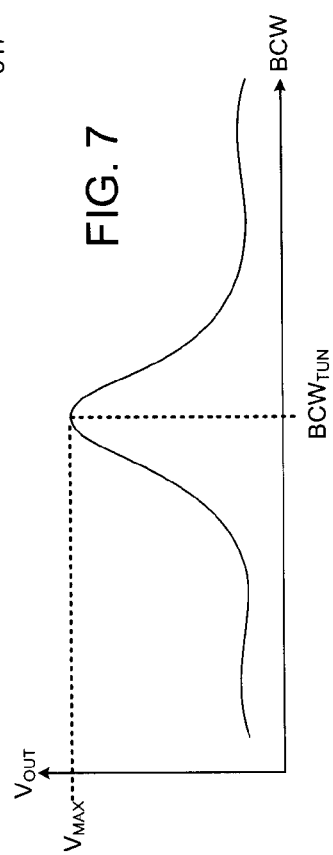

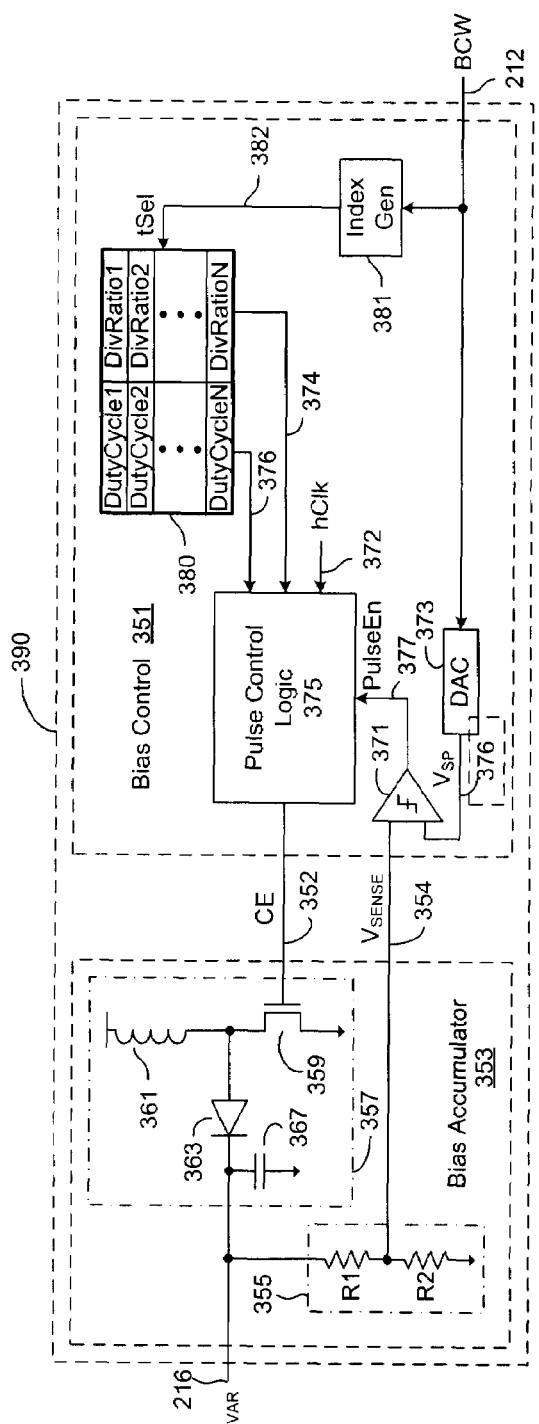
FIG. 8
FIG. 9
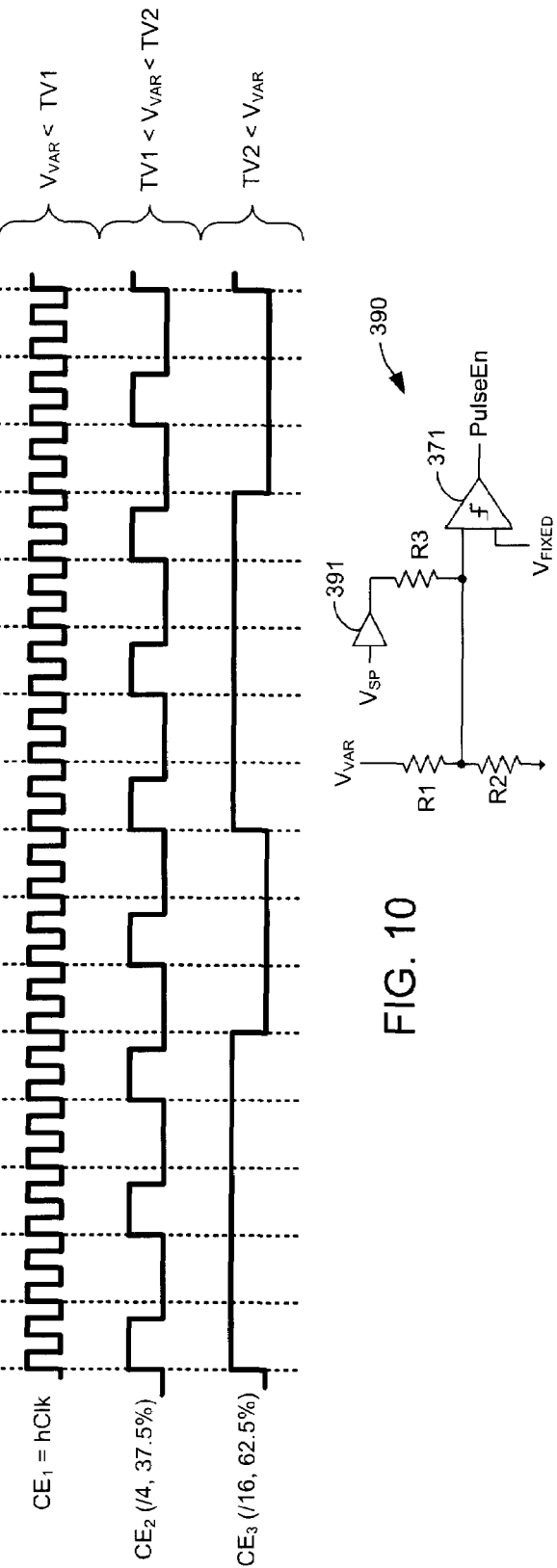
FIG. 10

BOOSTED-BIAS TUNABLE FILTER WITH DYNAMIC CALIBRATION

CROSS-REFERENCE TO RELATED APPLICATIONS

This application is a continuation of U.S. patent application Ser. No. 11/459,333 (now U.S. Pat. No. 7,427,907), filed Jul. 21, 2006, entitled "Boosted-Bias Tunable Filter with Run-Time Calibration," hereby incorporated by reference in its entirety, which claims priority from U.S. Provisional Application No. 60/701,652, filed Jul. 21, 2005, entitled "A Boosted-Bias Tunable Filter with Calibration."

TECHNICAL FIELD

The present invention relates to the field of electronic communications.

BACKGROUND

FIG. 1 illustrates a prior-art communication 100 system having an integrated-circuit receiver/transmitter 101 and a frequency-selective input or output filter 103. The filter 103 is useful for suppressing out-of-band spurious signals, reducing dynamic range, eliminating harmonic distortions, power/noise matching to antennas, and so forth. In the case of a television receiver, for example, the filter 103 may be disposed at the signal input source (antenna 107) to eliminate interference from noise sources (e.g., cellular telephones and other radio-frequency (RF) devices) and to minimize the amount of extraneous power processed by subsequent receiver stages within IC 101. Furthermore, in the case of a television receiver, the filter 103 can be used to power match the receiver antenna, improving its reception performance and sensitivity.

Frequency-selective filters typically need to be tuned to center their passband within the frequency band of interest. For systems that have an intrinsically wide tuning range (either across a single wide-frequency band or across multiple smaller bands), such tuning can be extremely challenging to implement, often requiring passive inductors, capacitors, varactors and other components that further exacerbate the tuning challenge. In the system of FIG. 1, for example, a varactor (V1) is provided to enable the resonant frequency of a tank circuit formed by the varactor and an inductor (L1) to be adjusted through application of a 0-30 volt varactor bias voltage (the capacitance of a varactor is generally proportional to the inverse square-root of the bias voltage so that a 30 volt bias range enables a roughly 5-6×adjustment of varactor capacitance). In a typical implementation, a dedicated phase-locked-loop (PLL) device 105 fabricated in a 30-volt analog IC process is used to develop the varactor bias voltage. More specifically, a varactor is commonly provided as the charge storage device within the PLL device 105 (i.e., storing the output of a charge pump and thus developing the control voltage used to determine the oscillation rate of a voltage-controlled-oscillator (VCO)) so that, as a channel-select signal 110 is switched to select a passband of interest (e.g., by selecting a ratio between the frequency of the VCO output and the frequency of a reference clock signal), the voltage developed on the PLL varactor is increased or decreased and thus may be output to the filter 103 as the varactor bias voltage. Typically, inductor L1 is adjusted manually to calibrate the filter passband for a given channel selection, thus slaving varactor V1 to the PLL varactor so that, as the channel-select signal is changed to select different channels within the broader frequency band, the varactor bias voltage is adjusted accordingly to establish the desired passband within the filter.

A major disadvantage of the above-described filter-tuning arrangement, aside from the added cost of the dedicated PLL IC, is that tuner calibration (i.e., the slaving of varactor V1 to the PLL varactor) is generally performed only once, at system production time, and thus fails to account for run-time temperature and voltage variations. System 100 is also susceptible to loss of calibration due to component aging, or from vibration, shock or other physical perturbations common in mobile applications, which tends to disturb the setting of the manually adjusted inductor.

BRIEF DESCRIPTION OF THE DRAWINGS

The present invention is illustrated by way of example, and not by way of limitation, in the figures of the accompanying drawings and in which like reference numerals refer to similar elements and in which:

FIG. 3 illustrates the boosted-bias tunable filter arrangement of FIG. 2 in absence of downstream receiver stages;

FIG. 4 illustrates an exemplary tunable filter network and its interconnection to a boosted-bias generator modeled by a voltage source and series resistance;

FIG. 5 illustrates an embodiment of a pilot tone generator that may be included in the calibration engines of FIGS. 3 and 4;

FIG. 6 illustrates an exemplary calibration operation that may be carried out to tune the tunable filter network of FIGS. 3 and 4;

FIG. 7 illustrates an exemplary plot of $V_{OUT}$ that results from sweeping the bias control word across a range of interest, and the voltage peak ($V_{MAX}$) that occurs when the filter network is tuned to the desired center frequency;

FIG. 8 illustrates an embodiment of a boosted-bias generator that may be used to implement the boosted-bias generator of FIG. 3;

FIG. 9 illustrates exemplary sequences of charge-enable pulses for three different binary control word ranges, and thus for three different ranges of the varactor bias voltage;

FIG. 10 illustrates an alternative circuit arrangement for the comparison of the sense voltage and setpoint voltage;

DETAILED DESCRIPTION

A dynamically calibrate-able, boosted-bias tunable filter is disclosed in various embodiments. In one embodiment, circuitry for generating and calibrating a tuning-control voltage, referred to herein as a varactor bias voltage, is implemented in the same logic IC (i.e., an integrated circuit device fabricated using a standard logic process such as a complementary metal-oxide-semiconductor (CMOS) process) as other signal reception/transmission stages, thereby obviating the above-described dedicated 30-volt PLL device typically employed in the prior-art and thus generally reducing system cost and simplifying construction. A small number of discrete components (some or all of which may be integrated within the logic IC or another IC) are provided to close the boosted-bias control loop through the logic IC and a tunable-filter network, thus enabling a calibration operation to be performed during system run-time as often as needed to compensate for voltage/temperature-induced drift, component aging or physical perturbation.

Figure 1:
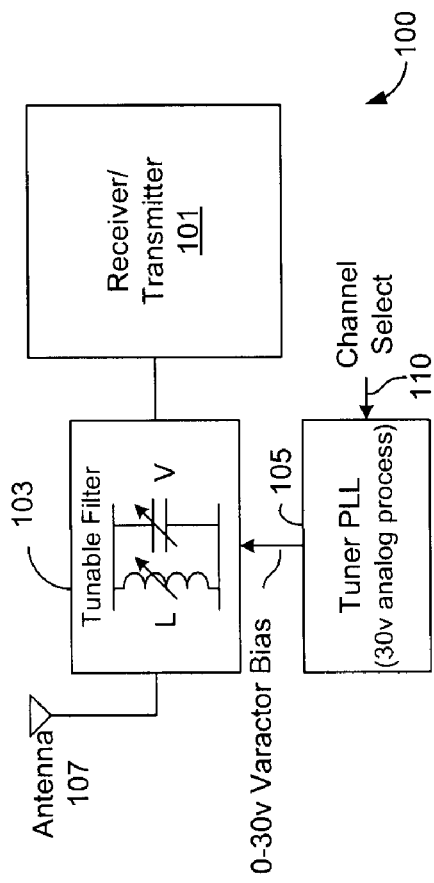
FIG. 1 illustrates a prior art packet communication system having a frequency-selective filter at its input or output.
Figure 2:
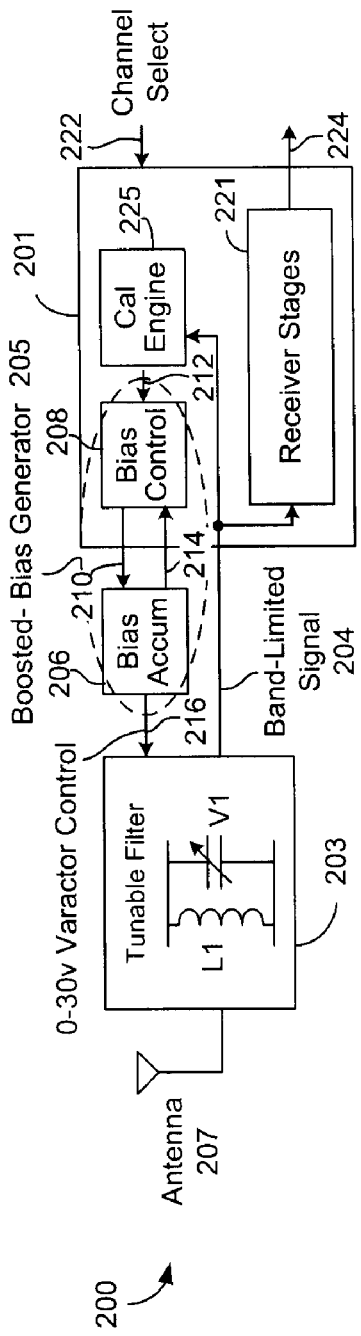
FIG. 2 illustrates a broadcast signal receiver system having a boosted-bias tunable filter according to an embodiment of the invention.

FIG. 2 illustrates a broadcast signal receiver system 200 having a boosted-bias tunable filter according to an embodiment of the invention. The system 200 includes a receiver IC 201, tunable filter network 203, and a set of passive components that form a voltage accumulator 206, referred to herein as a bias accumulator. The tunable filter network 203 includes a tank circuit formed by a varactor V1 and an inductor L1 (though other types of filter networks may be used) and is coupled to receive a radio-frequency (RF) input signal via antenna 207 (or an equivalent RF signal source, such as a cable television signal). In the implementation shown, the filter network 203 operates as a band-pass filter that filters the RF input signal to provide a band-limited signal 204 centered at a frequency specified by a channel-select input 222. The band-limited signal 204 is provided to subsequent receiver stages 221 (e.g., a superheterodyne receiver, zero intermediate-frequency receiver, etc.) which extract one or more information bearing signals 224 (i.e., digital and/or analog signals of interest). The band-limited signal 204 is also supplied to the calibration engine 225 to enable dynamic calibration of the varactor bias voltage 216, which, in the exemplary system of FIG. 2 and other embodiments described below, is a 0-30 volt varactor bias voltage. More specifically, in one embodiment, the calibration engine 225 outputs a digital control value, referred to herein as a bias control word 212 (BCW), to the bias control circuit 208 which, in turn, generates occasional bursts of logic-level charge-enable pulses 210 (CE) which are used to develop the varactor bias voltage 216 within the boosted bias accumulator 206. A voltage sensor is provided within the bias accumulator to return a scaled version of the bias voltage 214, referred to herein as the sense voltage, to the bias control circuit 208, thus closing a feedback loop that is used to maintain the varactor bias voltage 216 at the target level specified by the bias control word 212.

It should be noted that, while the system of FIG. 2 and embodiments which follow are depicted and described in terms of a broadcast signal receiver, the boosted-bias tunable filter 203 therein may alternatively be applied in a signal transmitter, and the signal source may be optically or electrically conducted to or from the signal receiver/transmitter rather than being received or radiated by antenna 207. Also, while components within the tunable filter 203 and bias accumulator 206 are described below in terms of discrete components coupled to the receiver IC 201 (or to a transmitter IC), any or all of the components may be integrated into the receiver/transmitter IC 201 or within a multiple-die integrated circuit package in alternative embodiments. Also, while the system has been described in terms of a bandpass filter and a particular component arrangement, notch filters or other types of filters with a tunable, selective frequency range within a broader band may be implemented using the circuits and techniques described herein, and various different components and/or component arrangements may be used to implement the filter.

Dynamic Calibration

FIG. 3 illustrates the boosted-bias tunable filter arrangement of FIG. 2 in absence of downstream receiver stages (or upstream transmitter stages). The calibration engine 225 responds to a calibrate-enable signal 240 (CalEnable, which may be received from other circuitry within the receiver/transmitter IC 201 or from another source within the communication system) by generating a pilot tone 241 having a frequency specified by the channel select signal 222 (ChanSelect). In the embodiment of FIG. 3, the pilot tone 241 is injected into the signal reception path at the input of the tunable filter 203 through a hardwired or switched connection (e.g., through a transistor or mechanical switch), though the pilot tone 241 may be injected at other points within the tunable filter network 203 in alternative embodiments. In either case, the filter output (i.e., the band-limited signal 204) is returned to the calibration engine 225, where it is measured to establish a filter output sample for a given setting of the bias control word 212. As discussed, the bias control word 212 is provided to the boosted-bias generator 205 which, in response, generates a corresponding varactor voltage 216 that is used to bias a varactor within the tunable filter network 203.

FIG. 4 illustrates an exemplary tunable filter network 251 and its interconnection to a boosted-bias generator 252, modeled by a voltage source ($V_{BIAS}$) and series resistance ($R_{BIAS}$). The tunable filter network 251 is coupled to receive the pilot tone 241 via antenna 207, modeled as a 50 ohm load resistance $R_{ANT}$ 209. The filter network 251 consists of an input capacitance which acts to transform the antenna load resistance to a higher impedance, since the selectivity of the filter is directly proportional to the impedance within the resonant network formed by V1 and L1. Under this transformation effect, the reactance of the capacitance formed by C1 and C2 will convert the antenna impedance (which is in series with the input capacitance) to an equivalent shunt impedance in parallel with V1 and L1 equal to $R_{ANT}+(1/\omega C^2 R_{ANT}^2)$, where $\omega$ is the resonant frequency of the tank formed by L1 and V1. In the particular example shown, the input capacitance is implemented by a primary capacitor C1 and one or more secondary capacitors C2 which may be switchably (or fusibly) decoupled from the primary capacitor C1 to establish an appropriate input capacitance for a given application. Though not specifically shown, other components of the filter network 251 may likewise be implemented by sets of parallel and/or series components that enable the filter tuning range to be tailored according to application demands. A tank circuit formed by inductor L1 and varactor V1 is provided to establish the filter passband. That is, the filter passband occurs at the resonance point of the tank circuit, the frequency at which the impedance of the inductor L1 (jwL) and varactor V1 (1/jwC) match. The boosted-bias generator 252 is coupled in parallel with the varactor V1 to develop a steady-state bias voltage thereon, and thus establish the width of the intrinsic region of the varactor V1's P-N junction, thereby establishing the capacitance of the varactor V1. Isolation capacitor C3 is provided to prevent the inductor L1 from drawing steady-state current from the boosted-bias generator 252.

FIG. 5 illustrates an embodiment of a pilot tone generator 280 that may be included in the calibration engines of FIGS. 3 and 4. As shown, the channel-select signal 222 is provided, together with a reference clock signal 282, to a frequency synthesizer 281 which outputs a frequency-multiplied clock signal 283 to the gate of transistor 285. In one embodiment, the frequency synthesizer 281 is formed by a phase-locked loop that outputs a small-swing clock signal 283 having a frequency according to a loop divide ratio selected by the channel-select signal 222. The frequency-multiplied clock signal 283 is supplied to the gate of transistor 285, which is coupled in series with resistor 287 between a logic-level supply rail and ground and thus amplifies the frequency-multiplied clock signal 283 to yield a frequency-synthesized clock signal 284, which is output through a transforming capacitor 289 to provide the pilot tone 241. In one embodiment, the reference clock signal 282 is generated by a high-precision oscillator (e.g., a crystal oscillator) so that the frequency of the pilot tone 241 is accurately centered within the selected frequency band (i.e., the selected channel). It should be noted that while the pilot tone generator 280 is depicted in FIG. 5 as a single-ended oscillator, a differential oscillator may be used in alternative embodiments to achieve improved common-mode noise rejection and reduced ground-bounce (in such an embodiment, the frequency synthesizer outputs a differential clock signal in which component signals are applied to counterpart transistors of a differential amplifier). More generally, any of the single-ended circuits described or depicted herein may be implemented as differential circuits having virtual, rather than actual, grounds.

FIG. 6 illustrates an exemplary calibration operation that may be carried out to tune the tunable filter network of FIGS. 3 and 4. Initially, at 301 (e.g., in response to a calibrate-enable signal), the pilot tone generator is enabled to generate a pilot tone, having a frequency according to the channel-select signal, and is switchably coupled (or injected directly) to the filter input. At 303, a loop index, 'i,' is reset to a predetermined starting value, $i_{MIN}$ (zero in this example), in preparation for the calibration operation, and at 305, the calibration engine initializes the bias control word, $BCW_i$, to a minimum value to establish a minimum varactor bias voltage (a varactor bias voltage in this example) for the first iteration of a repeated loop. At 307, the filter output voltage, $V_{OUT}(i)$, that corresponds to the bias control word $BCW_i$, is sampled by the calibration engine (e.g., an analog-to-digital converter (ADC) within the calibration engine, and recorded within a temporary storage as a first $V_{OUT}$ sample. Thereafter, at 309, the loop index is incremented and then compared with the maximum index (i.e., at 311). If the loop index does not exceed the maximum index, $i_{MAX}$, the bias control word is incremented at 311, and the operations at 307 and 309 are repeated to record a $V_{OUT}$ sample for the incremented bias control word. When the loop index is determined to exceed the maximum index, the bias control word has been swept across a range of interest and corresponding filter output samples, $V_{OUT}$ ($i_{MIN}$)–$V_{OUT}(i_{MAX})$ recorded. Accordingly, at 313, the $V_{OUT}$ samples are evaluated to determine a maximum recorded $V_{OUT}$ ($V_{MAX}$) and the corresponding bias control word, $BCW_{TUN}$. FIG. 7 illustrates an exemplary plot of $V_{OUT}$ that results from sweeping the bias control word across a range of interest, and the voltage peak ($V_{MAX}$) that occurs when the filter network is tuned to the desired point of resonance (i.e., when $BCW=BCW_{TUN}$). Thus, by setting the bias control word to $BCW_{TUN}$ as shown at 315 of FIG. 6, the passband of the tunable filter network is centered at the desired frequency. The calibration operation is completed at 317 by decoupling the pilot tone generator from the filter input and/or disabling the pilot tone generator.

In one embodiment, the calibration operation shown in FIG. 6 is performed at system power-up for each possible channel selection (i.e., a full-spectrum calibration operation is performed) and the resulting set of bias control words (i.e., $BCW_{TUN}$ for each channel) recorded in a set of registers. Thereafter, when a given channel is selected, the corresponding bias control word is selected from the register set and provided to the boosted-bias generator to establish the desired passband. The full-spectrum calibration operation may be repeated periodically thereafter or in response to detecting selected events (e.g., threshold number of signaling errors, changed channel selection, explicit user request, etc.). In an alternative embodiment, instead of full-spectrum calibration, calibration is performed for each channel as that channel is selected, and (optionally) periodically thereafter or in response to selected events.

The calibration operation described in reference to FIG. 6 may be changed in numerous ways, without departing from the scope of the present invention. For example, instead of a linear search in which the binary control word is incremented by a predetermined or programmed step size, a binary search or other type of more rapidly converging search (e.g., coarse-step search, followed by fine-step search in smaller range) may be carried out to determine $BCW_{TUN}$. Also, in the case of a notch filter or other type of suppression filter, a minimum rather than maximum filter output may be determined. Also, the individual operations shown in FIG. 6 (which may be carried out by dedicated hardware, a programmed processor or any combination thereof) may be reorganized to simplify max/min determination. For example, when each $V_{OUT}$ sample is captured, the sample may be compared with the maximum $V_{OUT}$ found up to that point in the search and installed as the new maximum $V_{OUT}$ (and the corresponding binary control word recorded as the prospective $BCW_{TUN}$) if greater. In such an embodiment, the loop index may be omitted.

Boosted-Bias Generation

FIG. 8 illustrates an embodiment of a boosted-bias generator 390 that may be used to implement the boosted-bias generator 205 of FIG. 3, which includes the bias accumulator and bias control components (206, 208) shown in FIG. 2. The bias accumulator includes a charge pump 357 that responds to charge-enable pulses 352 (CE) from the bias control circuit 351 to develop a varactor bias voltage 216 ($V_{VAR}$), and a voltage sensor 355 coupled to the charge pump output to generate a sense voltage 354 ($V_{SENSE}$) that is fed back to the bias control circuit 351 to enable closed-loop operation. The charge pump 357 consists of a control transistor 359, having a gate terminal coupled to receive charge-enable pulses 352 from the bias control circuit 351, and coupled in series with an inductor 361 between a logic-level power supply (for example, a 3.3V or 1.8V supply powering the receiver integrated circuit) and ground. The anode of an isolating diode 363 is coupled to the drain of the control transistor 359 and the cathode of the diode 363 is coupled to a smoothing capacitor 367. By this operation, the current that is enabled to flow through inductor 361 and control transistor 359, when the control transistor 359 is switched on (i.e., during the on-time (logic-high state) of a charge-enable pulse 352), is diverted via diode 363 to the smoothing capacitor 367, when the control transistor 359 is switched off, thereby increasing the charge on the smoothing capacitor 367 and thus pumping up the varactor bias voltage 216, potentially well above the power supply from which the current originated. In one embodiment, the voltage sensor 355 includes a voltage-divider formed by resistors R2 and R1, having values R and 9R, respectively. Accordingly, the voltage-divider generates a sense voltage 354, $V_{SENSE}$, that is scaled to ten percent (10%) of the varactor bias voltage 216 and returned to the bias controller 351 for comparison with a setpoint voltage 376 ($V_{SP}$, generated by a digital-to-analog converter 373 (DAC) in response to the bias control word 210 received from the calibration engine) in comparator 371. In one embodiment, when the sense voltage 354 is less than the setpoint voltage 376, the comparator 371 asserts a pulse-enable signal 377 to enable pulse control logic 375 to output charge-enable pulses 352 to the bias accumulator 353, thus raising the varactor bias voltage 216 and, in turn, the sense voltage 354. When the sense voltage 354 rises above the setpoint voltage 376, the comparator 371 deasserts (e.g., lowers) the pulse-enable signal 377 to disable the pulse control logic 375 from issuing further pulses. Through this closed-loop operation, the bias control circuit 351 issues pulses until the varactor bias voltage 216 reaches a desired setpoint (i.e., $10*V_{SP}$) and then ceases issuing pulses until the varactor bias voltage 216 again falls below the setpoint. The resistors which form the voltage-divider network 355 are selected to present a relatively high impedance (e.g., 2.7 mega-ohms (MΩ) and 0.3 MΩ for a total of 3 MΩ), and the filter network itself presents a relatively high impedance load so that the discharge time constant of the smoothing capacitor 367 is fairly long, thus establishing a low-ripple varactor bias voltage 216. In one embodiment, the pulse control 375 generates pulses of different widths and duty cycles (i.e., time the pulse is high as a percentage of the total cycle time between rising edges), according to the varactor bias voltage 216 specified by the bias control word 210. That is, for relatively low varactor bias voltages, the discharge rate of the smoothing capacitor 367 is slower than for higher varactor bias voltages, thus reducing ripple by issuing bursts of relatively high-frequency, low-duty-cycle pulses, thus avoiding overshoot that may result from injecting larger amounts of charge with each pulse. By contrast, when the varactor bias voltage 216 is higher, the smoothing capacitor 367 discharges more rapidly, and ripple is reduced by issuing higher duty cycle pulses at lower frequency.

In one embodiment, the pulse control logic receives a relatively high-frequency clock signal 372, hClk, as well as a setpoint-specific duty cycle selector 376 and divisor selector 374. The pulse control logic 375, in turn, generates an internal pulse stream, gated by the pulse-enable signal 377 (PulseEn) and having a frequency according to the hClk frequency 372 divided by the specified divisor (i.e., specified by the divisor selector 374), and a duty cycle according to the duty cycle selector 376. In the embodiment of FIG. 8, a lookup table of duty cycle selectors and divisors 380 is indexed according to the value of the bias control word 212 to select a voltage-appropriate duty cycle 376 and divisor 374 to the pulse control logic 375. More specifically, the bias control word 212 is supplied to an index generator 381 which generates a corresponding table selection value 382 (i.e., a different table selection value 382 is generated for each of a set of bias control value ranges) which, in turn, is applied to a lookup table 380 to retrieve the desired duty cycle selector 376 and divisor 374. In one embodiment, the index generator 381 includes one or more programmable registers to enable the full range of bias control words 212 to be decomposed into programmatically defined sub-ranges that are associated with respective table indices. The lookup table 380, itself, may also be programmable to enable duty cycle selectors 376 and/or divisors 374 to be programmed according to application needs. In alternative embodiments, where a relatively small number of bias-control subranges are employed, the lookup table 380 may be replaced by a multiplexed set of registers.

FIG. 9 illustrates exemplary sequences of charge-enable pulses for three different binary control word ranges, and thus for three different ranges of the varactor bias voltage, $V_{VAR}$. When the varactor bias voltage is below a first threshold voltage, TV1, the hClk itself is output as the charge-enable pulses, thus providing a relatively high frequency pulse train, $CE_1$, to avoid ripple at low varactor bias voltages. As the varactor bias voltage is increased (i.e., due to a higher-valued bias control word) above TV1 but still below a second threshold voltage, TV2, a divisor of four and a 37.5% duty cycle (3/8) are selected to provide a somewhat lower frequency, lower duty-cycle pulse train, $CE_2$. As the varactor bias voltage is increased further above TV2, a higher divisor value, 16, and higher duty cycle (62.6%) are selected to provide a yet lower frequency pulse train $CE_3$ with higher duty cycle, thus providing more substantial charge injection with each pulse to counteract the faster discharge rate within the bias accumulator.

Returning to FIG. 8, it should be noted that numerous alternative circuit arrangements may be used to implement the bias accumulator 353 and bias control circuits 351. FIG. 10, for example, illustrates an alternative circuit arrangement for the comparison of the sense voltage and setpoint voltage. Instead of using a voltage-mode digital-to-analog converter to establish a voltage $V_{SP}$ within the feedback control loop, a fixed reference voltage is fed to comparator 371. This avoids having a variable reference voltage in the comparator, which can mitigate voltage-dependent offsets and other impairments within the comparator. To provide same functionality as before, a voltage-mode digital-to-analog converter (which before would have provided $V_{SP}$) is coupled through resistor R3 in FIG. 10 to the sense voltage. Since the feedback loop forces the sense voltage to be equal to $V_{FIXED}$, the variable current flow through R3 causes the voltage at R1 to vary proportional to said variable current. Thus, the variable current achieves the same function as the setpoint voltage without requiring the comparator to have a variable reference voltage. Similarly, as discussed, the bias control circuit 351 may be implemented without the lookup table 380 and index generator 381.

It should be noted that the various integrated circuits, dice and packages disclosed herein may be described using computer aided design tools and expressed (or represented) as data and/or instructions embodied in various computer-readable media, in terms of their behavioral, register transfer, logic component, transistor, layout, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal lines. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '$\overline{<signalname>}$') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

Various aspects and features of embodiments disclosed herein are set forth, for example and without limitation, in the following numbered clauses:

1. A signal communication device comprising:
   a frequency-selective filter having at least one component that is biased by a control signal to establish a center frequency of the frequency-selective filter; and
   a closed-loop bias generator to generate the control signal and to adjust the control signal based, at least in part, on a comparison of the control signal and a reference signal.

2. The signal communication device of clause 1 wherein the closed-loop bias generator comprises:
   a bias control circuit to generate charge-enable pulses; and
   a bias accumulator that accumulates charge in response to the charge-enable pulses, the accumulated charge establishing a voltage level of the control signal.

3. The signal communication device of clause 2 wherein the bias control circuit comprises:
   a comparator to compare the reference signal and the control signal and to generate a pulse-enable signal in either a first state or a second state according to the comparison of the control signal and the reference signal; and
   pulse control logic to output the charge-enable pulses to the bias accumulator when the pulse-enable signal is in the first state and to cease outputting the charge-enable pulses to the bias accumulator when the pulse-enable signal is in the second state.

4. The signal communication device of clause 1 wherein the at least one component is a varactor and wherein the control signal is a varactor bias voltage.

5. The signal communication device of clause 4 wherein the closed-loop bias generator is implemented in part within an integrated circuit device that is powered by a logic-level supply voltage, and in part by a set of discrete components that operate to generate a varactor bias voltage within a range of voltages that extends to a higher voltage than the logic-level supply voltage.

6. The signal communication device of clause 5 wherein the integrated circuit device comprises a signal receiver coupled to receive a filtered signal from the frequency-selective filter and to recover an information-bearing signal from the filtered signal.

7. The signal communication device of clause 5 wherein the integrated circuit device comprises a signal transmitter coupled to output a modulated carrier to the frequency-selective filter.

8. The signal communication device of clause 1 further comprising a digital-to-analog converter to generate the reference signal at a level indicated by a digital control word.

9. The signal communication device of clause 1 wherein the closed-loop bias generator comprises a bias control circuit to generate a sequence of charge-enable pulses with a duty cycle determined, at least in part, by a digital control word that indicates a desired level of the control signal.

10. The signal communication device of clause 1 wherein the closed-loop bias generator comprises a bias control circuit to generate a sequence of charge-enable pulses at a frequency determined, at least in part, by a digital control word that indicates a desired level of the control signal.

11. The signal communication device of clause 1 further comprising a calibration circuit to generate a sequence of digital control words that establish respective levels of the control signal and to determine which of the digital control words yields either a maximum or minimum output from the frequency-selective filter.

12. The signal communication device of clause 11 further comprising a plurality of storage elements, each to store a respective digital control word that yields a maximum or minimum output from the frequency-selective filter for a corresponding channel selection.

13. An integrated circuit device comprising:
    a calibration circuit coupled to receive a band-limited signal from an external filter network and to determine digital control words that yield maximum or minimum levels of the band-limited signal for respective frequency bands within a broader frequency spectrum; and
    a bias control circuit to generate a control signal for controlling a center frequency of the external filter network within a selected one of the frequency bands based, at least in part, on the respective one of the digital control words.

14. The integrated circuit device of clause 13 wherein the calibration circuit comprises circuitry to generate, for each of the frequency bands, a sequence of digital control words and to compare levels of the band-limited signal that result for each digital control word of the sequence of digital control words.

15. The integrated circuit device of clause 13 wherein the bias control circuit comprises circuitry to generate a sequence of pulses that may be applied within an external bias accumulator circuit to develop a bias voltage for controlling the center frequency of the external filter network.

16. The signal communication device of clause 15 wherein the circuitry to generate the sequence of pulses comprises circuitry to generate the sequence of pulses with a duty cycle determined, at least in part, by a selected one of the digital control words.

17. The signal communication device of clause 15 wherein the circuitry to generate the sequence of pulses comprises circuitry to generate the sequence of pulses at a frequency determined, at least in part, by a selected one of the digital control words.

18. A method of tuning a frequency-selective filter having a center frequency that is established by a control signal, the method comprising:
   generating a reference signal that corresponds to a desired center frequency;
   comparing the control signal with a reference signal to generate a comparison result; and
   adjusting the control signal according to the comparison result.

19. The method of clause 18 wherein generating a reference signal that corresponds to the desired center frequency comprises converting a digital control word into an analog reference signal.

20. The method of clause 18 wherein generating a reference signal that corresponds to the desired center frequency comprises generating a sequence of reference signals having respective signal levels to determine which of the sequence of reference signals yields either a maximum or minimum output from the frequency-selective filter.

21. An integrated circuit device comprising:
   means for receiving a band-limited signal from an external filter network and for determining digital control words that yield maximum or minimum levels of the band-limited signal for respective frequency bands within a broader frequency spectrum; and
   means for generating a control signal for controlling a center frequency of the external filter network within a selected one of the frequency bands based, at least in part, on the respective one of the digital control words.

22. Computer-readable media having information embodied therein that includes a description of an integrated circuit device, the information including descriptions of:
   a calibration circuit coupled to receive a band-limited signal from an external filter network and to determine digital control words that yield maximum or minimum levels of the band-limited signal for respective frequency bands within a broader frequency spectrum; and
   a bias control circuit to generate a control signal for controlling a center frequency of the external filter network within a selected one of the frequency bands based, at least in part, on the respective one of the digital control words.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

What is claimed is:

1. A signal communication system, coupled to a signal source that receives a broadcast spectrum from an electrically or optically conductive medium, to output a filtered representation of a broadcast-frequency video signal corresponding to a selected channel of a plurality of channels of the broadcast spectrum, the system comprising:
   frequency-selective filter circuitry, coupled to the signal source, to receive the broadcast-frequency video signal and to output the filtered representation of the broadcast-frequency video signal, the frequency-selective filter circuitry includes:
      a filter network, coupled to the signal source, to output the filtered representation of the broadcast-frequency video signal, the filter network includes a selectable center frequency of a frequency band which is associated with the selected channel wherein the filter network is responsive to a control signal; and
   control signal generator circuitry, coupled to the frequency-selective filter circuitry, to generate the control signal having a voltage amplitude which is associated with the selected channel, the control signal generator circuitry includes:
      a control signal generator circuit, coupled to the filter network, to generate and output the control signal having the voltage amplitude which is associated with the selected channel; and
      a feedback circuit, coupled to the filter network and the control signal generator circuit, to sense the voltage amplitude of the control signal, wherein the feedback circuit generates and outputs a feedback signal which is representative of the voltage amplitude sensed thereby;
   wherein the control signal generator circuitry determines whether the feedback signal is different from the control signal having the voltage amplitude which is associated with the selected channel, and when the feedback signal is different from the voltage amplitude of the control signal, the control signal generator circuitry responsively adjusts the amplitude of the voltage of the control signal.

2. The system of claim 1 wherein the control signal generator circuitry further includes a pulse generator to generate a charge enable signal having a programmable duty cycle, wherein the control signal generator circuit is coupled to the pulse generator to generate and output the control signal using the charge enable signal.

3. The system of claim 1 wherein the control signal generator circuitry further includes a pulse generator to generate a charge enable signal having a programmable frequency, wherein the control signal generator circuit is coupled to the pulse generator to generate and output the control signal using the charge enable signal.

4. The system of claim 1 wherein the control signal generator circuitry further includes a pulse generator to generate a charge enable signal having a programmable duty cycle and a programmable frequency, wherein the control signal generator circuit is coupled to the pulse generator to generate and output the control signal using the charge enable signal.

5. The system of claim 1 wherein the control signal generator circuitry further includes:
   memory to store data which is representative of a plurality of predetermined duty cycles;

selection circuitry, coupled to the memory, to select one of the plurality of predetermined duty cycles using a selection signal and to output information which is representative thereof, wherein the selection signal is associated with the selected channel of the broadcast spectrum;
a pulse generator, coupled to the selection circuitry, to generate the charge enable signal having a duty cycle corresponding to the information output by the selection circuitry; and
wherein the control signal generator circuit is coupled to the pulse generator to generate and output the control signal using the charge enable signal.

6. The system of claim 1 wherein the control signal generator circuitry further includes:
memory to store data which is representative of a plurality of predetermined division ratios of a clock frequency;
selection circuitry, coupled to the memory, to select one of the plurality of predetermined division ratios using a selection signal and to output information which is representative thereof, wherein the selection signal is associated with the selected channel of the broadcast spectrum;
a pulse generator, coupled to the selection circuitry, to generate the charge enable signal having a frequency corresponding to the information output by the selection circuitry; and
wherein the control signal generator circuit is coupled to the pulse generator to generate and output the control signal using the charge enable signal.

7. The system of claim 1 wherein the control signal generator circuitry further includes:
memory to store data which is representative of a plurality of predetermined duty cycles and a plurality of predetermined division ratios of a clock frequency;
selection circuitry, coupled to the memory, to select one of the plurality of predetermined duty cycles and one of the plurality of predetermined division ratios using a selection signal and to output information which is representative thereof, wherein the selection signal is associated with the selected channel of the broadcast spectrum;
a pulse generator, coupled to the selection circuitry, to generate the charge enable signal having a duty cycle and a frequency corresponding to the information output by the selection circuitry; and
wherein the control signal generator circuit is coupled to the pulse generator to generate and output the control signal using the charge enable signal.

8. The system of claim 7 wherein the memory is a set of registers.

9. The system of claim 7 wherein the data is stored in the memory at system start-up.

10. The system of claim 1 wherein the filter network includes a filter having a pass-band that corresponds to and changes in accordance with the selectable center frequency.

11. The system of claim 1 wherein the filter network includes a filter having a band-stop that corresponds to and changes in accordance with the selectable center frequency.

12. The system of claim 1 wherein the filter network is a pass-band filter or band-stop filter.

13. The system of claim 1 wherein the filter network includes an adjustable impedance which is responsive to the voltage amplitude of the control signal.

14. The system of claim 1 wherein the filter network includes a voltage controlled capacitive element which is responsive to the voltage amplitude of the control signal.

15. The system of claim 14 wherein the voltage controlled capacitive element is a diode.

16. A signal communication system, coupled to a signal source that receives a broadcast spectrum from an electrically or optically conductive medium, to output a filtered representation of a broadcast-frequency video signal corresponding to a selected channel of a plurality of channels of the broadcast spectrum, the system comprising:
frequency-selective filter circuitry, coupled to the signal source, to receive the broadcast-frequency video signal and to output the filtered representation of the broadcast-frequency video signal, the frequency-selective filter circuitry includes:
a filter network, coupled to the signal source, to output the filtered representation of the broadcast-frequency video signal, the filter network includes a selectable center frequency of a frequency band of the filter network which is associated with the selected channel wherein the filter network is responsive to a control signal; and
control signal generator circuitry, coupled to the frequency-selective filter circuitry, to generate the control signal having a voltage amplitude which is associated with the center frequency of the filter network, the control signal generator circuitry includes:
memory to store data which is representative of a plurality of predetermined duty cycles and a plurality of predetermined division ratios;
selection circuitry, coupled to the memory, to select one of the plurality of predetermined duty cycles and one of the plurality of predetermined division ratios using a selection signal, and to output information which is representative thereof, wherein the selection signal is associated with the selected channel of the broadcast spectrum;
a pulse generator, coupled to the selection circuitry and the filter network, to generate the charge enable signal having a duty cycle and a frequency corresponding to the information output by the selection circuitry; and
a control signal generator circuit, coupled to the pulse generator, to generate and output the control signal having a voltage amplitude which is associated with the selected channel using the charge enable signal.

17. The system of claim 16 wherein the memory is a set of registers.

18. The system of claim 16 wherein the data is stored in the memory at system start-up.

19. The system of claim 16 wherein the filter network includes a filter having a pass-band that corresponds to, and changes in accordance with, the selectable center frequency.

20. The system of claim 16 wherein the filter network includes a filter having a band-stop that corresponds to, and changes in accordance with, the selectable center frequency.

21. The system of claim 16 wherein the filter network is a pass-band filter or band-stop filter.

22. The system of claim 16 wherein the filter network includes an adjustable impedance which is responsive to the voltage amplitude of the control signal.

23. The system of claim 22 wherein the filter network includes a voltage controlled capacitive element which is responsive to the voltage amplitude of the control signal.

24. The system of claim 23 wherein the voltage controlled capacitive element is diode.

25. The system of claim 16 wherein the control signal generator circuit further includes:
a transistor having a first terminal and a gate terminal;
an inductor having a first terminal coupled to the first terminal of the transistor and a second terminal coupled to a fixed voltage; and a diode having an anode coupled to the first terminals of the transistor and the inductor and a cathode coupled to the frequency-selective filter circuitry.

26. A signal communication system, coupled to a signal source that receives a broadcast spectrum from an electrically or optically conductive medium, to output a filtered representation of a broadcast-frequency video signal corresponding to a selected channel of a plurality of channels of the broadcast spectrum, the system comprising:

frequency-selective filter circuitry, coupled to the signal source, to receive the broadcast-frequency video signal and to output the filtered representation of the broadcast-frequency video signal, the frequency-selective filter circuitry includes:

a filter network, coupled to the signal source, to output the filtered representation of the broadcast-frequency video signal, the filter network includes a pass-band filter having a pass-band that corresponds to and changes in accordance with the selected channel wherein the pass-band filter is responsive to a control signal; and control signal generator circuitry, coupled to the frequency-selective filter circuitry, to generate the control signal, the control signal generator circuitry includes:

memory to store data which is representative of a plurality of predetermined duty cycles;

selection circuitry to select one of the plurality of predetermined duty cycles using a selection signal and to output information which is representative thereof, wherein the selection signal is associated with the selected channel of a plurality of channels of the broadcast spectrum;

a pulse generator, coupled to the selection circuitry and the filter network, to generate the charge enable signal having a duty cycle and a frequency corresponding to the information output by the selection circuitry; and a control signal generator circuit, coupled to the pulse generator, to generate and output the control signal having a voltage amplitude which is associated with the selected channel using the charge enable signal.

27. The system of claim 26 wherein the memory is a set of registers.

28. The system of claim 26 wherein the data is stored in the memory at system start-up.

29. The system of claim 26 wherein the filter network includes an adjustable impedance which is responsive to the voltage amplitude of the control signal.

30. The system of claim 29 wherein the filter network includes a voltage controlled capacitive element which is responsive to the voltage amplitude of the control signal.

31. The system of claim 30 wherein the voltage controlled capacitive element is a diode.

32. The system of claim 26 wherein the control signal generator circuit further includes:

a transistor having a first terminal and a gate terminal;

an inductor having a first terminal coupled to the first terminal of the transistor and a second terminal coupled to a fixed voltage; and a diode having an anode coupled to the first terminals of the transistor and the inductor and a cathode coupled to the frequency-selective filter circuitry.

33. A signal communication system, coupled to a signal source that receives a broadcast spectrum from an electrically or optically conductive medium, to output a filtered representation of a broadcast-frequency video signal corresponding to a selected channel of a plurality of channels of the broadcast spectrum, the system comprising:

frequency-selective filter circuitry, coupled to the signal source, to receive the broadcast-frequency video signal and to output the filtered representation of the broadcast-frequency video signal, the frequency-selective filter circuitry includes:

a filter network, coupled to the signal source, to output the filtered representation of the broadcast-frequency video signal, the filter network includes a pass-band filter having a pass-band that corresponds to and changes in accordance with the selected channel wherein the pass-band filter is responsive to a control signal; and control signal generator circuitry, coupled to the frequency-selective filter circuitry, to generate the control signal, the control signal generator circuitry includes:

memory to store data which is representative of a plurality of predetermined division ratios;

selection circuitry, coupled to the memory, to select one of the plurality of predetermined division ratios using a selection signal, and to output information which is representative thereof, wherein the selection signal is associated with the selected channel of the broadcast spectrum;

a pulse generator, coupled to the selection circuitry and the filter network, to generate the charge enable signal having a frequency corresponding to the information output by the selection circuitry; and a control signal generator circuit, coupled to the pulse generator, to generate and output the control signal having a voltage amplitude which is associated with the selected channel using the charge enable signal.

34. The system of claim 33 wherein the memory is a set of registers.

35. The system of claim 33 wherein the data is stored in the memory at system start-up.

36. The system of claim 33 wherein the filter network includes an adjustable impedance which is responsive to the voltage amplitude of the control signal.

37. The system of claim 36 wherein the filter network includes a voltage controlled capacitive element which is responsive to the voltage amplitude of the control signal.

38. The system of claim 37 wherein the voltage controlled capacitive element is a diode.

39. The system of claim 33 wherein the control signal generator circuit further includes:

a transistor having a first terminal and a gate terminal;

an inductor having a first terminal coupled to the first terminal of the transistor and a second terminal coupled to a fixed voltage; and a diode having an anode coupled to the first terminals of the transistor and the inductor and a cathode coupled to the frequency-selective filter circuitry.

* * * * *